United States Patent [19]
Mastrangelo

[11] 3,990,098
[45] Nov. 2, 1976

[54] STRUCTURE CAPABLE OF FORMING A DIODE AND ASSOCIATED CONDUCTIVE PATH

[75] Inventor: Sebastian Vito Rocco Mastrangelo, Hockessin, Del.

[73] Assignee: E. I. Du Pont de Nemours and Co., Wilmington, Del.

[22] Filed: Dec. 12, 1974

[21] Appl. No.: 532,296

Related U.S. Application Data

[63] Continuation-in-part of Ser. No. 317,382, Dec. 22, 1972, Pat. No. 3,864,715.

[52] U.S. Cl. .................................... 357/2; 338/20; 340/173 SP; 357/1; 357/45; 357/72
[51] Int. Cl.² .................... H01L 27/04; H01L 45/00
[58] Field of Search ................... 357/1, 2, 72, 45; 338/20; 340/173 SP

[56] References Cited
UNITED STATES PATENTS

| | | |
|---|---|---|
| 3,407,495 | 10/1968 | Montgomery .................. 338/20 X |
| 3,685,026 | 8/1972 | Wakabayashi et al. ................. 357/2 |
| 3,685,028 | 8/1972 | Wakabayashi et al. ................. 357/2 |
| 3,699,543 | 10/1972 | Neale ..................................... 357/2 |
| 3,766,096 | 10/1973 | Mastrangelo .................... 338/20 X |
| 3,864,715 | 2/1975 | Mastrangelo ......................... 357/1 |

*Primary Examiner*—William D. Larkins

[57] ABSTRACT

A diode-forming layered structure comprising a semiconductor body having a layered coating thereon, said semiconductor having a surface region of given conductivity type, said coating being a dispersed metal particle-polymer coating which before electrical activation displays a high electrical resistance but after electrical activation is highly conductive, said electrical activation resulting in the formation of a diode in the zone of contact between the coating and the semiconductor body, a plurality of such layered structures, in a two-dimensional array based on a common semiconductor body, being useful in the formation of a read-only memory (ROM), an alterable read-only memory (AROM) or a random access memory (RAM).

29 Claims, 9 Drawing Figures

STRUCTURE CAPABLE OF FORMING A DIODE AND ASSOCIATED CONDUCTIVE PATH

CROSS-REFERENCE TO RELATED APPLICATION

This is a continuation-in-part of application Ser. No. 317,382 filed Dec. 22, 1972 and issued Feb. 4, 1975 as U.S. Pat. No. 3,864,715.

BACKGROUND OF THE INVENTION

1. Field of the Invention

This invention relates to layered structures which are useful for the simultaneous formation of diodes and associated conductive paths, to diodes and associated conductive paths formed in such structures and to memories formed from a plurality of such structures.

2. Description of the Prior Art

It is known in the art that a diode can be formed by positioning a metal wire point contact on a semiconductor body and passing an electrical current through the wire. The current must be sufficient to locally melt and diffuse metal atoms from the tip of the wire; the diode is formed in the zone of contact. Also known in the art is a programmable read-only memory (ROM) in which a certain type of a thin insulating layer on a substrate semiconductor is subjected to an electrical breakdown to form an electrical contact with a preformed diode in the substrate semiconductor. Presently known means involving electrical breakdown of a thin, insulative metal oxide film require heating, to first form a diode at each memory location by thermal diffusion, depositing the insulating film over each diode and then metalizing, using vacuum techniques. A distinct need exists in the semiconductor memory industry for a ROM which is conveniently and reliably prepared and electronically writable at a fixed voltage to form structures singly or in an array, each structure comprising a conductive path in series with a simultaneously formed stable diode. A need also exists for an analogous alterable read-only memory (AROM), that is, wherein such conductive-path-diode structures can be switched "off" or "on" (hereinafter referred to as OFF and ON). Further, a need exists for a random access memory (RAM) in which such conductive path-diode structures can be switched rapidly between ON and OFF a very great number of times.

SUMMARY OF THE INVENTION

It is an object of this invention to provide structures which are capable of yielding diodes and associated conductive paths upon application of an activating voltage. It is a further object to provide such structures wherein the required activating voltage is relatively constant from sample to sample. Still another object is to provide such structures which, after activation, can carry a wide range of reading currents without being damaged. Another object is to provide such structures which, after activation, are capable of existing in distinct ON and OFF states. A still further object is to provide such structures disposed in a two-dimensional array suitable for use as a read-only memory (ROM), an alterable read-only memory (AROM) and a random access memory (RAM).

The above objects are achieved by means of the present invention which resides in a layered structure comprising, in combination, a semiconductor body having a layered coating thereon, said semiconductor body having a surface region of a given conductivity type, said coating being a dispersed metal particle-polymer coating in contact with said surface region, the metal of said metal particles being capable of inducing a different type of conductivity in said surface region, the metal particles being insulatively encapsulated and being present in the coating in an amount sufficient to provide electrical conductivity through the coating and to form a diode in the zone of contact between said coating and said semiconductor body upon application of an activating voltage to the layered structure.

DESCRIPTION OF THE DRAWINGS

In FIG. 5 solid line, Y-axis address busses 20 and 21 contact underlying dispersed metal particle-polymer coatings 22, 23, 24 and 25. Coatings 22 and 23 in turn contact an underlying channel region 26 of semiconductor material having a given conductivity type. Similarly, coatings 24 and 25 contact an underlying channel region 27 of semiconductor material of given conductivity type.

Channel regions 26 and 27 are located in the surface of a common semiconductor body as shown in FIG. 6 which is a sectional view through FIG. 5 showing the component layers of such structures.

DETAILED DESCRIPTION OF THE INVENTION

Figure 1:
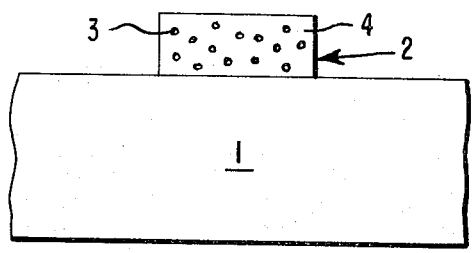
FIG. 1 is a side elevational view showing a semiconductor surface region 1 of a given P-type conductivity and an electrically activatable coating 2 comprising dispersed N-type conductivity-inducing metal particles 3 and polymer 4.

As already indicated, the invention herein resides in a layered structure comprising, in combination, a semiconductor body having a coating thereon, said semiconductor body having a surface region of a given conductivity type, said coating being a dispersed metal particlepolymer coating in contact with said surface region, said metal particles being capable of inducing a different type of conductivity in said surface region, being insulatively encapsulated and being present in the coating in an amount sufficient to provide electrical conductivity through the coating and to form a diode in the zone of contact between said coating and said semiconductor body upon application of an activating voltage to the layered structure.

The layered structures of this invention can be used to form a single diode or a multiplicity of diodes, with an associated switchable conductive path for each diode, for the control of electric current. For example, a plurality of such structures sharing a common semiconductor body can be used to form a memory device. In one embodiment of the invention the read-only memory (ROM) which is provided is formed of a plurality of diode-forming layered structures in a two-dimensional array connected by address busses. Normally in such an array the semiconductor body has numerous surface regions of a given conductivity type. In this embodiment the conductive path shows great stability. In one preferred aspect of this invention the activated structure has an ON state and an OFF state, either of which will persist over a long period of time, for example, years. Furthermore, switching between ON and OFF states can be carried out at least ten times. These characteristics enable the invention to be used in a ROM and in an alterable read-only memory (AROM). In another embodiment when the intended use is as a random access memory (RAM), it is preferred to use a polymer whose glass transition temperature ($T_g$) is very low, for example, an elastic binder, and to codisperse therein ferromagnetic particles and oxide-encapsulated aluminum particles. In this embodiment the conductive path may spontaneously break after a few days; however, its stability is sufficient for use in a RAM. The advantage of low $T_g$ in this use is that the structure can be rapidly switched between the ON and OFF states. When the elastic binder in the aforesaid RAM is a thermally stable fluorinated rubber, such as a commercially available fluoroolefin elastomer, the device can be operated at temperatures as high as 125° C. Other preferred embodiments of the invention include those wherein the metal particles are oxide-encapsulated aluminum particles, which metal is capable of acting as a P-type dopant for N-type silicon and germanium semiconductors, and oxide-encapsulated antimony particles, which metal is capable of acting as an N-type dopant for P-type silicon and germanium semiconductors.

The layered structure of this invention, with its conveniently prepared dispersed metal particle-polymer coating, simplifies the processing which may be required for semiconductor memory manufacture. Processing time and costs are reduced by coincident formation of both a diode and its associated conductive path in a single electrical activation step. Voltages required for activation are usually reproducible to within ½ volt. In the ON state the layered structures bear the useful asymmetric voltage-current characteristics of semiconductor diodes. They show low forward resistances and high reverse resistances over an acceptable voltage range. Although small currents will commonly be used to read such memory structures, larger currents, in some cases up to 100 milliamperes, can sometimes be used without damaging or switching the structures. Structures useful in forming an AROM are conveniently reprogrammed by application of rapidly decaying current pulses to switch OFF certain layered structures as desired and by application of voltage pulses to activate layered structures at other positions in an array, the layered structures which are switched OFF being capable of being switched ON again should the need arise. This invention also provides structures which are useful in forming a RAM which generally requires only 0.1–1 milliampere current pulses to be turned from ON to OFF and which can be cycled at least $10^8$ times without failure.

Metal Particles

The metal particles have two functions. Upon electrical activation they provide an electrically conductive path through the coating and they also form a diode in the zone of contact between the coating and the semiconductor body. As used in this application the term "diode" denotes a structure which performs electronically substantially in the manner usually attributed to a crystal diode. The metal which is selected for the metal particles must be capable of providing a different type of conductivity in the semiconductor surface region. For example, if the region is an N-type, that is, conductive by the movement of electrons, the metal selected is one which can act as an acceptor of electrons, thereby forming holes. If the surface region is a P-type, that is, conductive by the movement of holes, the metal selected is one which can act as a donor of electrons, thereby filling the holes until there is an excess of electrons. If the region comprises undoped, relatively high resistance semiconductor material having a low impurity content, that is, an intrinsic or almost intrinsic conductivity type, either of the above classes of metals can be used, but the former is preferred. Well known prior art includes classifications of metals as to impurity levels and their utilities as either acceptors for P-type conduction or donors for N-type conduction. For example, H. Brooks, "Advances in Electrons and Electron Physics", Volume 7, page 110, Academic Press, Inc., 1955, lists acceptors and donors for two major known semiconductors, germanium and silicon, used in microcircuitry. Other known semiconductors used in microcircuitry can also be used as the semiconductor bodies of this invention. These include the Group IIIA– Group VA (of the Periodic Chart of the Elements) semiconductors, such as GaAs, GaSb, InP, InAs and InSb, for which divalent metals generally serve as N-type inducing donors and quadrivalent metals generally serve as P-type inducing acceptors. In general, a single metal or a combination of metals can be employed, either as an acceptor or as a donor, for the particular semiconductor body of given type of conductivity. If a combination of metals is used, such combination can be in the form of particles of an alloy of the metals or in the form of a mixture of particles of each metal.

In order to function properly in this invention the metal or metals must be in the form of insulatively encapsulated particles. When the particles are insulatively encapsulated, as will be more fully described below, they will exhibit a resistance of at least about $10^8$ ohms (at a test voltage of about 20 volts) if pressed into a layer (a few millimeters thick), with a compressive force of about 10 grams, between metal electrodes of about 1 square inch area. Insulatively encapsulated particles have an electrically conductive interior and a dielectric surface that provides contact resistance when the particles touch. Suitable dielectric surfaces are preferably formed with an insulative material compound of the metal being coated, such as an oxide, sulfide or nitride of the metal. The most preferred insulatively encapsulated metal is aluminum containing the oxide film which forms on the surface of aluminum when it is exposed to the atmosphere. Also highly preferred are similarly encapsulated indium, antimony, titanium and cadmium particles. Other readily obtained metals which normally carry a suitable insulative oxide film are bismuth, chromium, cobalt, lead, magnesium, manganese, molybdenum, niobium, tantalum and tungsten. Other useful, insulative encapsulative materials include the sulfides and the nitrides of the metals. Insulative encapsulation can also be achieved by application of a polymeric coating. Polymeric encapsulation can be achieved, for example, as shown hereafter in Example 3 wherein ferromagnetic (iron) particles are so encapsulated.

The average size of the insulatively encapsulated metal particles is in the range of about 0.01–100 microns, preferably 0.01–50 microns, and especially 0.05–1 micron. The average particle size should be no greater than 0.1 the coating thickness.

Polymer

The function of the polymer in the layered structures of this invention is to maintain the metal particles in position and to provide a dielectric matrix for the particles. The polymer chosen should be non-reactive with other components of the system and it should have sufficient thermal stability to withstand the forming and use temperatures of the layered structures. The utility of the layered structures of this invention is considerably dependent upon the glass transition temperature ($T_g$) of the polymer used. If the $T_g$ is high, for example, at least 40° C. and preferably at least 100° C., the structures display great stability in the ON state, that is, the ON state maintains a constant low resistance over a long period of time. If the $T_g$ is at least 100° C. the ON state is sufficiently stable for devices employing the layered structures in a ROM and an AROM which are subjected to service at 125° C. In any event, no matter what the $T_g$ of the polymer, the structures are extremely stable in the latent and the OFF states. On the other hand, if the $T_g$ is so low that the coating composition is elastomeric, that is, if the polymer constitutes an elastic binder as hereinafter defined, then the metal of the metal particles of the coating composition can be selected, as hereinafter described, so that the structures thereby produced are capable of being switched between ON and OFF a great many times, for example, billions of times, and possess sufficient stability in the latent, ON and OFF states for use in a RAM. Such structures may not have sufficient stability in the ON state, however, for use in a ROM or an AROM.

Aromatic polyimides having a $T_g$ of at least 100° C., preferably at least 150° C., represent the most preferred class of polymers which are useful herein as binders, especially in a ROM and an AROM. Such polyimides and their preparation are well known in the art, for example, as shown by U.S. Pat. Nos. 3,179,614; 3,179,630; 3,179,631; 3,179,632; 3,179,633; 3,179,634; and 3,287,311. As disclosed in the prior art some polyimides are not easily fabricatable because of their high melting points. With such polyimides the metal particles which are required in the junction composition are introduced during the preparation of the polyimide. For example, they can be added to a solution of the polyamic acid, a fabricatable intermediate employed in the formation of the polyimide. Such a precursor polyamic acid, as a solution in N-methyl-2-pyrrolidone, is available commercially under the designation "PYRE-ML" Wire Enamel RC-5057. Insulatively encapsulated aluminum particles are readily dispersed in it. The polyimide produced from such a polyamic acid can withstand a temperature of 450° C. for short periods of time and it can withstand continuous use at 220° C. The polyimide produced from such a polyamic acid and having aluminum particles dispersed in it can withstand heating for sufficient time to form, by alloying, ohmic low resistance contacts of aluminum conductors to silicon semiconductor devices in the same or neighboring elements of an AROM array.

Known organic silicone polymers which contain O-Si-O moieties in the backbone polymer chain and which are capable of being crosslinked are also preferred for uses where a high $T_g$ is desired. Such polymers which are solvent-soluble and curable are disclosed, for example, in U.S. Pat. Nos. 3,451,838 and 3,460,980. Commercially available polymers of this type, for example, Glass Resin 100, in the form of powders and flakes, can be conveniently dissolved in a suitable volatile solvent, such as ethanol, to serve as a dispersing medium for the metal particles. Subsequent air drying to remove the volatile solvent and to enhance polymeric bonding can be carried out at a variety of temperatures, depending on the particular silicone polymer employed.

Aromatic polyamides having a high $T_g$ represent another class of preferred organic polymers which are useful in this invention. The diamines which are suitable for the formation of the aforesaid polyimides are also suitable for the preparation of the polyamides. Such polyamides are disclosed in U.S. Pat. Nos. 3,006,899; 3,094,511; 3,232,910; 3,240,760; and 3,354,127.

Suitable known organic polymers of high $T_g$ and which are useful herein also include polyolefins, polyvinyl derivatives, such as polyvinyl acetates and polyvinyl alcohols, polybenzimidazoles, polyesters, poly(amide-imides), poly(ester-imides), polysulfones, polycarbonates, polyacrylonitriles, polymethacrylonitriles, polymethyl methacrylates, polystyrenes, poly(α-methylstyrenes), cellulose esters, such as cellulose acetates, cellulose acetate butyrates, cellulose triacetates and cellulose nitrates, and alkylated celluloses, such as ethyl cellulose.

By the term elastic binder is meant an insulating material which is capable of elongation with substantial recovery of its original dimensions. Preferably, the elastic binder (when tested without the dispersed particles) should be capable of being elongated at least 100% (A.S.T.M. D412 test), and still retract to less than 1.5 times its original length. Representative elastic binders with such properties, as disclosed, for example, in U.S. Pat. Nos. 3,766,095 and 3,766,096, include natural rubber, synthetic polyisoprene rubbers, elastomeric chloroprene polymers, fluoroolefin elastomers, butadiene-styrene rubbers, ethylene-propylene-nonconjugated diene rubbers, silicone rubbers and rubbery condensation polymers, such as polyurethanes obtained by reaction of a polyisocyanate and a polyalkylene glycol. The elastic binder can also contain fillers, reinforcing agents or plasticizers provided such additives do not interfere with the capabilities of the dispersed metal particles upon activation.

Semiconductor Layer

Suitable semiconductor bodies, either doped or intrinsic, are known in the art. Such a body (for example, a chip) generally has a surface region of the same type conductivity as the rest of the body. If desired, however, one or more surface regions can be doped, using art-recognized techniques, to change the conductivity characteristics. For the purposes of this invention, the given type of conductivity of the surface region can be adjusted to be N-type, P-type, $N^+$-type, $P^+$-type or intrinsic, that is, undoped.

Coating Composition

The encapsulated metal particles are used in the coating composition of this invention in an amount which is sufficient to achieve the electrical activation which is marked by a sudden transition to a state of low resistance, that is, the ON state. The amount should not be so large that the coating fails to maintain its physical integrity in use. The amount of metal particles generally is 10–90% by volume of the coating composition, preferably 40–80% by volume. When the amount is below about 10%, electrical activation may require repeated attempts or it may not occur. Amounts above 90% make the coating composition crumbly and the surface of the coating layer uneven. Other materials can be incorporated into the polymer matrix with the metal particles provided their presence does not interfere with the capability of the metal particles to provide both a conductive path and a diode upon activation. When it is desired to provide layered structures which are capable of forming diodes with associated conductive paths and wherein it is possible to switch back and forth between the ON and OFF states a very large number of times, the coating composition must contain ferromagnetic particles, such as iron, nickel or cobalt particles, or a mixture thereof, in addition to encapsulated metal particles which are selected to provide both a conductive path and a diode. Compositions which contain aluminum particles and ferromagnetic particles, for example, the compositions disclosed in U.S. Pat. No. 3,766,095, can serve this purpose. In the preparation of such compositions the ratio of the weights of ferromagnetic particles to aluminum particles is adjusted so as to be in the range 0.17:1 to 2:1 and the weight of the ferromagnetic and aluminum particles is about 40–80% by weight of the coating composition exclusive of volatile components, provided, however, that the aluminum particles constitute at least about 10% by volume of the coating. In one preferred composition the ratio of the weights of ferromagnetic particles to aluminum particles is about 1.5:1 and the combined weights of the particles is 60–70% of the composition weight exclusive of volatile components. Other metals can be employed in place of aluminum, which is preferred, provided they are insulatively encapsulated and occupy essentially the same volume as the aluminum particles. Alloys of aluminum and other metals can also be employed in particulate form; such alloys preferably should be principally aluminum.

Another class of coating composition having improved bistable ON-OFF switching characteristics comprises insulatively encapsulated aluminum particles, insulatively encapsulated iron (or other ferromagnetic) particles and an elastic binder for the particles, wherein such composition the weight ratio of iron ferromagnetic particles to aluminum particles is in the range of about 0.17:1 to 3.5:1, preferably 1.5:1 to 2.5:1, and the weight of the encapsulated aluminum and iron or ferromagnetic particles is about 25–85%, preferably 60–70%, by weight, of the coating composition exclusive of volatile components, provided, however, that the encapsulated aluminum particles constitute at least about 10% by volume of the coating. Other metals and alloys, such as described above, can be employed in place of aluminum provided the above-recited conditions are met.

The ferromagnetic particles referred to above generally are electrically conductive; they are made nonconductive by encapsulating the individual particles with an insulating material using known techniques. The higher the insulative value of the material, that is, the higher its volume resistivity, the thinner it can be. Although suitable thicknesses usually range from a fraction of a micron to several microns, it is more convenient to specify that the insulating material must be about 0.5–6% by weight, preferably 1–3%, of the combined weights of said material and particles. The volume resistivity of the insulating material should be at least about $10^{11}$ ohm-cm. at 50% relative humidity and 23° C. Insulating materials include organic and inorganic polymers, especially polymers such as those recited above as elastic binders. Such materials should be chemically inert in the presence of coating components and should be selected so as to be insoluble in the solvent for the binder.

Formation of the Coating and Coating Layer

The coating composition and the coating layer can be formed employing known techniques for dispersing metal particles in a polymer and for obtaining a layer of desired thickness and shape. Optionally, the coating composition can contain a volatile solvent. Methods which are useful for the application of the coating composition to the semiconductor substrate include brushing, spraying, dipping, spinning, casting and extrusion techniques. Alternatively, the coating can be formed on a temporary support, such as transfer paper, and applied to the semiconductor surface before or after removal from the temporary support. If a volatile solvent is present in the coating composition, part or all of it can be removed either before or after formation of the coating. When employing polymers which require heating to effect crosslinking or, as in the case of polyamic acid, cyclization, a heating step may be included in the formation of the coating.

Although coating thickness is not critical, it will usually be in the range of about 0.1–6,000 microns, more usually 1–1,000 microns.

Electrical Activation and Switching

The layered structures of this invention can exist in a latent state and in an ON state. Certain embodiments can also exist in an OFF state. In the latent state the resistance usually is greater than 10 megohms and may be greater than 100 megohms; the resistance in the OFF state is similar in magnitude to the resistance in the latent state. In the ON state the resistance attributable to the coating, per se, is very low and may be from a small fraction of an ohm up to 10 ohms for structures made with non-elastomeric polymers and up to $10^4$–$10^5$ ohms for structures made with elastomers. The resistance attributable to the semiconductor body exclusive of the diode is extremely dependent upon the choice of materials and the geometry of the semiconductor body; it may be as high as $10^4$ ohms. The diode is non-ohmic and cannot be said to have a resistance expressible as a finite number of ohms. However, measurements made with a low voltage meter (at 2–5 volts) indicate less than 100 ohms forward resistance and at least $10^4$ ohms reverse resistance.

Figure 2:
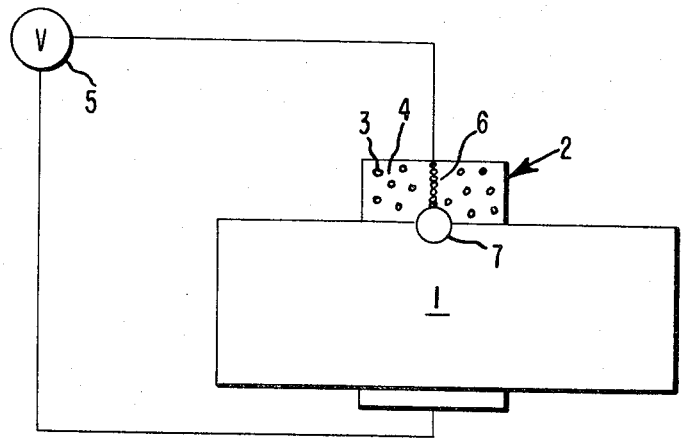
FIG. 2 is a side elevational view showing the structure of FIG. 1, after electrical activation by means of direct current (D.C.) voltage supply 5, wherein there is formed at least one conductive chain 6 of metal particles 3 through polymer 4 and a diode in the zone of contact 7 between coating 2 and semiconductor surface region 1.

As initially formed the structure of this invention is in the latent state. In the manner described below it can be altered from the latent state to the ON state. The transition from the latent state to the ON state is called electrical activation. The most preferred method of electrical activation involves the application across the layered structure of a D.C. pulse of short duration, usually between a microsecond and a millisecond. Preferably, the polarity of the D.C. pulse is adjusted to obtain optimum low forward and high reverse diode resistances upon activation. When the thickness of the coating is less than about 25 microns, a potential of 5–15 volts is usually sufficient; for greater thicknesses, potentials up to several hundred volts may be required. Preferably, the current is limited to less than about 100 milliamperes although limitation to lower currents may be required if sensitive circuit components lie in the current path. FIG. 2 illustrates this method of electrical activation. Also generally applicable for electrical activation is the brief application of an A.C. potential. In this case the application should not be significantly more brief than ½ cycle. In other respects the procedure is the same as described above for D.C. activation.

Figure 5:
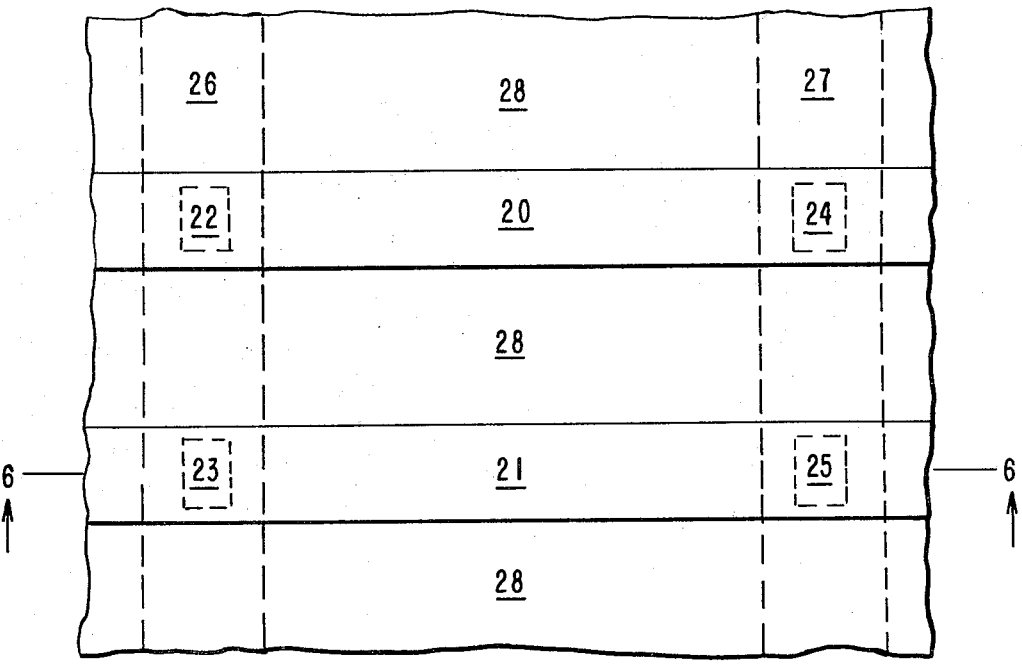
FIG. 5 is a plan view of a memory array containing a plurality of diode-forming structures.
Figure 6:
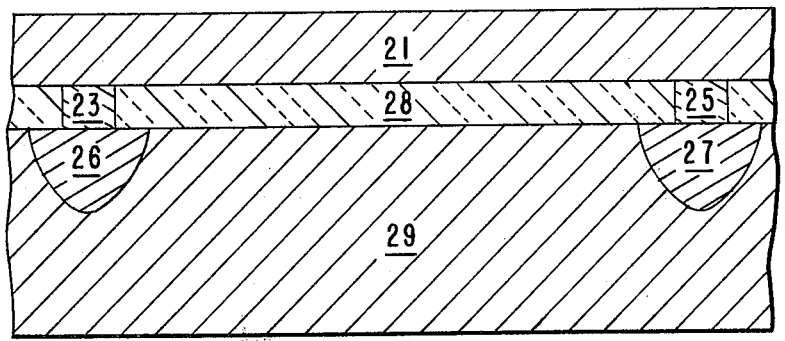
In FIG. 6 address buss 21 contacts coatings 23 and 25. Coatings 23 and 25 are separated by coplanar layer 28 of electrically insulative material. Channel regions 26 and 27 are located in the surface of common semiconductor body 29 which underlies the entire array shown in FIG. 5. Channel regions 26 and 27 are represented as N-type material and the common semiconductor body as P-type material although other combinations of N-type, P-type, N$^+$ type, P$^+$ type and intrinsic conductivity can sometimes be employed.

For an array such as that illustrated in FIGS. 5 and 6 the activating voltage can be selectively applied by means of an address buss and an electrical contact to a channel region. Usually, ½ the activation voltage is applied to one of the "word" line X-axis busses, for example, 21, and ½ the activation voltage of opposite polarity is applied to the "bit" line Y-axis channel, for example, 27, that corresponds to the position where a diode-forming structure is to be activated. Typically, the voltage necessary for activation varies by no more than ½ volt over 10 diode-forming layered structures. If desired the addressing procedure can be varied, for instance, by grounding word lines and applying the full activating potential to bit lines.

Those structures which are capable of existing in the OFF state can be switched to the OFF state by application of a small current-limited pulse which is regulated so that at the end of the pulse the current drops very rapidly to a new low value, usually zero. Such switching can be accomplished with current-limited pulses as small as 0.1–1 milliamperes for low $T_g$ polymer coatings and about 1–100 milliamperes for high $T_g$ polymer coatings. By a current-limited pulse is meant a brief flow of current which is kept below a predetermined magnitude by a means such as a resistor in series with the switching device. If the structure is in the OFF state, it can be switched to the ON state by application of a voltage (turn-ON voltage) of about 10–300 volts, the voltage being regulated so that at the end of the pulse the current drops slowly to a low value, usually zero. The voltage required to turn ON a structure is less than that required to activate the same structure. In other respects the procedures for activation and turning ON are substantially equivalent. For rapid switching, such as is necessary in a RAM, D.C. voltage for turning On is preferred.

An alternate method of electrical activation, useful only for a layered structure which is not to be turned OFF, is the application of an A.C. discharge. Frequently useful for this purpose is a commercially available device known as a vacuum tester; however, with such a device it is difficult to precisely localize the activation. Generally, a very brief application of the vacuum tester discharge is sufficient; the electrode of the vacuum tester is kept out of contact with the layered structure.

EXAMPLES

Figure 7:
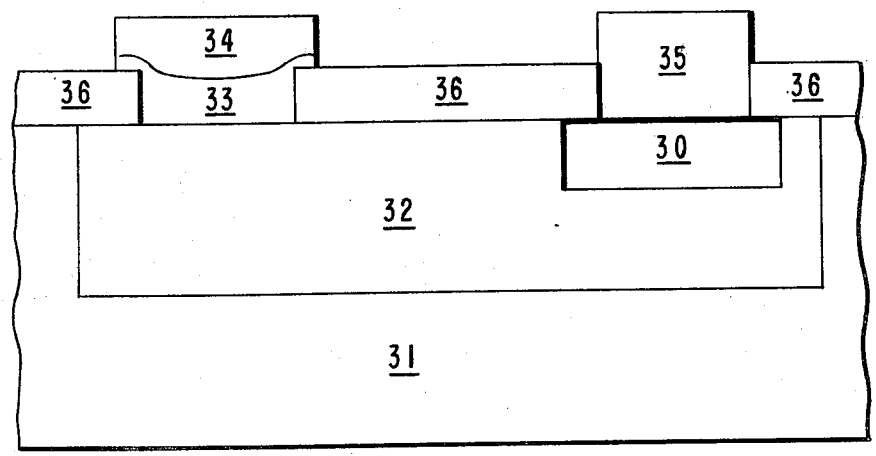
FIG. 7 is a side elevational view which shows adjacent N$^+$ region 30 and P-type region 31 suitably related to a surface semiconductor region 32 of given N-type conductivity and coating 33 to permit side-by-side application of metallized electrodes 34 and 35 in contact with coating 33 and N$^+$ region 30. Coplanar layer 36 of electrically insulative material prevents electrode contact with regions 31 and 32.

Example 1 illustrates a layered structure that can be used to form an AROM. The comparison portion of Example 1 illustrates that the metal particles must be properly chosen. Example 2 illustrates that undoped semiconductor material can serve as the semiconductor body in this invention. Example 3 illustrates a layered structure that can be used to form a RAM and shows how the formed diode and its associated conductive path can be switched OFF and ON repeatedly. Example 4 illustrates a layered structure that can be used to form an AROM and shows how the activated structure can be switched between the ON and OFF states. Example 5 illustrates the diode characteristic obtained by activation of a diode-forming structure with adjacent semiconductor body regions suitably predoped to permit side-by-side electrical contacts on a semiconductor wafer as shown in FIG. 7.

Example 1

A P-type germanium semiconductor body having a planar surface 5 mm. by 5 mm. and a thickness of 2 mm. was doped with sufficient gallium to provide a resistivity of 18.8 ohm-cm. A surface opposing the planar surface was coated with a commercially available, conductive silver paint and dried in contact with an underlying aluminum foil as the electrode. To form a layered structure as shown in FIG. 1 a metalpolymer composition was prepared by dispersing 6.0 grams of oxide-encapsulated, 200 mesh (U.S. Sieve Series) antimony powder in 10.0 grams of a polyamic acid solution (1.8 grams of polyamic acid in N-methyl-2-pyrrolidone). This composition was then coated onto the planar surface of the P-type semiconductor and cured by air drying for 1 hour, heating at 135° C. for ½ hour and then heating at 300° C. for 1 hour to form a 41% by volume antimony-polyimide coating which was 50 microns thick. A spot of the same conductive silver paint, about 2 mm. in diameter, was then applied to the exposed surface of the coating to identify a contact area; the electrical resistance between this spot and the base aluminum foil electrode was measured and found to be greater than 100 megohms. Electrical connections were made to these electrodes momentarily, as shown in FIG. 2, providing an activating potential of 100 volts in series with a 100,000 ohm current-limiting resistor. The resistance between the painted spot and the foil was then measured with a commercially available ohmmeter (having about 1.5 volts test voltage) and found to be 1,000 ohms in the forward direction (with the foil at a positive test potential) and 10,000 ohms in the reverse direction (with the foil at a negative test potential). The diode so formed thus exhibited a factor of 10 in rectification, large enough to serve as a diode in a ROM.

The above experiments were repeated using, instead of antimony powder, 4 grams of commercially available, oxideencapsulated, non-leafing, bright aluminum powder of 100 mesh (U.S. Sieve Series) as the metal dispersed in the polyamic acid solution. After supplying the coating (52% aluminum by volume) and electrodes as above, the same activating potential was applied. The resulting structure exhibited 100 ohms resistance in each direction, demonstrating that no diode results when aluminum, an improperly selected metal, is used in combination with a semiconductor body having P-type conductivity.

Example 2

Figure 3:
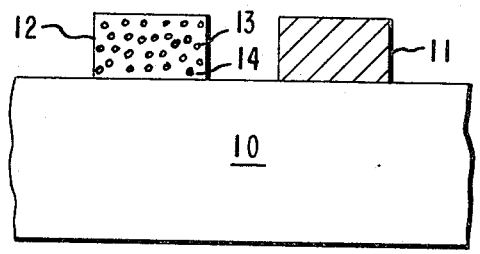
FIG. 3 is a side elevational view showing an undoped semiconductor surface region 10, a permanently conductive electrode 11 for diode operation and an electrically activatable coating 12 comprising dispersed, N-type, conductivity-inducing metal particles 13 and polymer 14.
Figure 4:
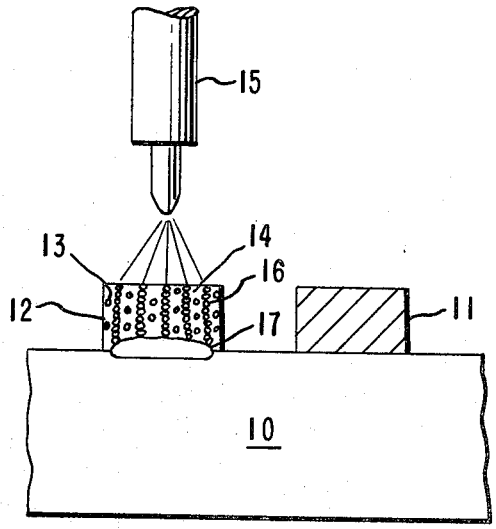
FIG. 4 is a sectional view showing the structure of FIG. 3, with permanently conductive electrode 11, during electrical activation by means of an alternating current (A.C.) voltage supply 15, such as a vacuum tester capable of providing multiple activating discharges, a plurality of discharge-formed conductive paths 16 of metal particles 13 through polymer 14 and associated diodes in the zone of contact 17 between coating 12 and semiconductor surface region 10.

In this example was employed an undoped, silicon semiconductor chip having a planar surface 15 mm. by 15 mm., a thickness of 3 mm., 10 parts of impurity per million parts of chip and a resistivity of 14 ohm-cm. Opposing edge electrodes of vacuum-deposited gold were applied to two opposite sides 15 mm. apart and orthogonal to the planar surface. The resistance between gold electrodes was 45 ohms. To form a structure as shown in FIG. 3 a metal-polymer coating composition was prepared by dispersing aluminum powder (of the type disclosed in Example 1) in an equal weight of a commercially available, powdered organic polysiloxane dissolved in ethanol. A drop of the aluminum-glass resin coating composition was positioned on the planar surface of the undoped, silicon semiconductor body about midway between the two edge electrodes and a copper wire electrode having a diameter of 0.5 mm. was embedded in the drop as it cured (by drying at 150° C.). The diameter of the drop was about 5 mm. as cured; it contained about 26% by volume of aluminum after curing. Electrical resistance between the copper wire and either gold electrode was infinite when measured with the ohmmeter of Example 1. A vacuum tester, as shown in FIG. 4, was arced to the coating for about 30 seconds. The electrical resistance between each gold electrode and the copper wire was remeasured with the ohmmeter. The forward resistance to either gold electrode (coating was at a positive test potential) was 25 ohms with a reading current of about 60 milliamperes and the reverse resistance was 250 ohms (providing a factor of 10 in rectification). The diode so formed was stored for several months, during which time it continued to be switchable between the ON and OFF states.

Example 3

Figure 8:
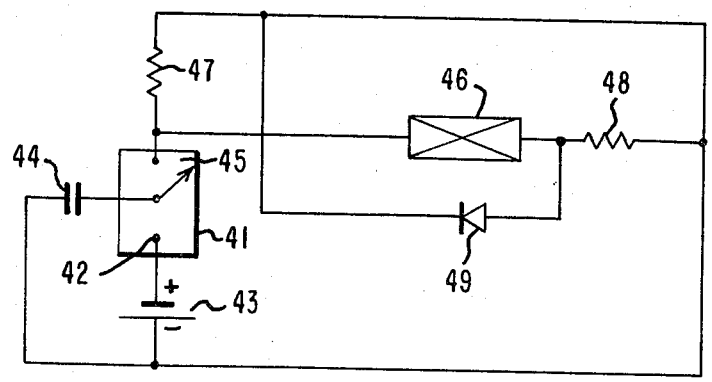
FIG. 8 is an activating circuit diagram.
Figure 9:
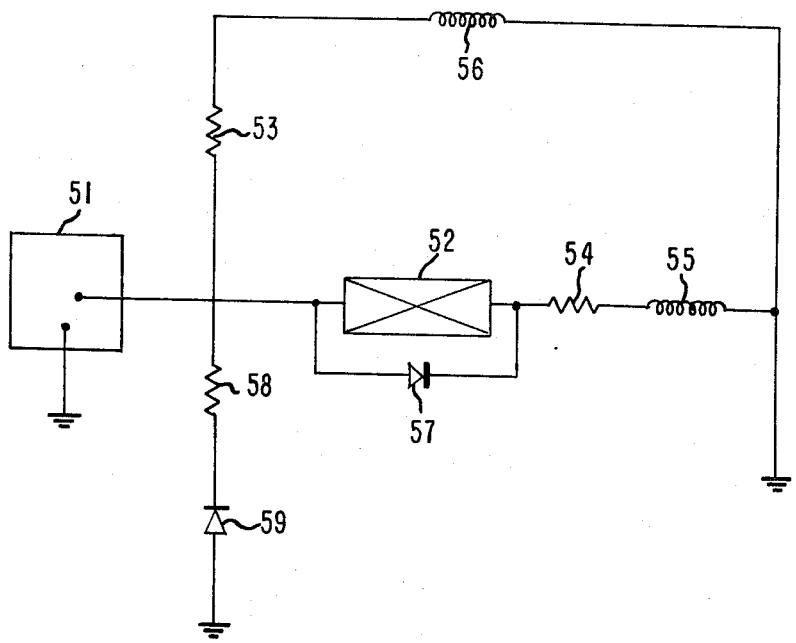
FIG. 9 is a diagram of a pulse circuit for repeated cycling.

An encapsulating composition was prepared as follows. Iron powder, 100 grams of a commercially available material, was dispersed in a solution of 3 grams of a commercially available 52:44:4 (by weight, approximate) terpolymer of ethylene, propylene and a diene (1,4-hexadiene) in 500 cc. of toluene. The mixture was stirred while 150 cc. of acetone were added slowly. This caused an initial precipitation of the hydrocarbon terpolymer on the iron powder. An additional 750 cc. of acetone were added with thorough mixing to harden the terpolymer. The suspension was then allowed to settle and the liquid was decanted off. The mixture was again stirred with acetone and the solvent was again decanted off. The stirring with acetone and the decantation were carried out two more times and then the iron powder was air dried to form a free-flowing encapsulated iron powder which exhibited an electrical resistance of 100 megohms as a layer pressed between test electrodes as described above. 25 Grams of the free-flowing encapsulated iron were mixed with 15 grams of commercially available, oxide-encapsulated aluminum powder and dispersed in 55.6 grams of an 18% solution of a polyurethane rubber (reaction product of toluene-2,4-diisocyanate and 3-(allyloxy)-1,2-propanediol) in dimethylformamide containing 3.5% by volume of water. This formed the coating composition. A polished, undoped silicon wafer having slight N-type conductivity was painted on its underside with a commercially available conductive silver paint. The vehicle was then volatilized off to form an electrode. Two coats of the coating composition were then applied to an area 0.25 inch in diameter on the upper side of the wafer opposite the silver paint electrode. The first coat was dried for 24 hours and the second coat was dried for 4 hours, both at 80°–90° C. The total thickness of the coating was about 25 mils. Commercially available spring-loaded contacts were pressed against the silver paint electrode from below and the heat-cured coating from above to provide electrical connections to the activation circuit substantially as shown in FIG. 8. Electrical activation was carried out as follows with reference to the numbered circuit components in the figure. The 0.01 microfarad capacitor 44 was charged to 100 volts potential, by means of battery 43 by throwing switch 41 to lower position 42, and then discharged to the above-prepared layered structure by throwing the switch to upper position 45. A 500,000 ohm series resistor 48 limited the current flow during activation to a maximum of 0.2 milliampere and a 270,000 ohm parallel resistor 47 provided a time constant for the discharge of about 2.7 milliseconds. Silicon diode 49 shorted out any reverse transient voltage that may have developed. After electrical activation the resistance of the structure between the spring-loaded contacts was determined to have changed from infinity before activation to asymmetrical resistances of 10,000 ohms and 100,000 ohms (10:1 rectification) as measured with the ohmmeter of Example 1. The direction of east current flow (that is, positive current convention) was from the coating side to the silver paint side of the wafer-layered structure. To demonstrate utility as a switchable diode of a RAM the structure was connected to a circuit similar to that of FIG. 9, which circuit is useful for turning OFF a switching device that is initially in its ON state. Voltage source 51, when interrupted, results in rapid decay of circuit current. Voltage source 51 consists of a common Schmitt trigger circuit working off a sine wave generator into a one-shot multi-vibrator section and a coupling capacitor to provide a shaped current pulse as desired. Upon application of a first pulse the switching device 52 is turned OFF by the rapidly decaying current but electrical charge tends to remain on both sides of the switch. Such charge may develop sufficient potential difference to turn ON the switch again. Typical means for removing the excess charge promptly is shown in FIG. 9. It may be bled through a parallel resistor 53 to ground. At the other side of the switch it may be bled through variable series resistor 54 to ground. Difficulty also may arise because of a difference in the time constants for bleeding off the charges from both sides of the switch. Such difficulty can be overcome by those skilled in the art by introducing pulse time delay inductors 55 and 56 as shown, for example, in series and in parallel with the switching device. A switch by-pass consisting of a commercially available 1N-4005 silicon diode 57 serves to eliminate transient voltages in the circuit. An additional path to ground composed of resistor 58 and a silicon diode 59, such as a 1N-4005 diode, serves to shape and limit the amplitude of turn OFF pulses. With the circuit operating so as to provide alternately a voltage pulse of 35 volts and a rapidly decaying current pulse of less than 10 milliamperes, the structure was observed to cycle continually between the ON and OFF states at a frequency of 1,000 Herz. During this cycling a potential of 3 volts was used to measure the resistance; the following results were obtained; ON state forward, 10,000 ohms; ON state reverse direction, 100,000 ohms; OFF state, greater than 10 megohms (the upper limit of the resistance measuring equipment). This performance was confirmed by coating a second, undoped silicon wafer as disclosed above and activating electrically as disclosed above; substantially the same rectification and switching characteristics were noted.

Example 4

An undoped silicon semiconductor chip similar to that of Example 2 was cleaned in 49.0% hydrofluoric acid for 16 hours. A metal-polymer coating composition was prepared by dispersing 3.0 grams of aluminum powder (of the type disclosed in Example 1) in 10.0 grams of a polyamic acid solution (0f the type disclosed in Example 1). In order to provide two diode-forming structures two drops of the composition were coated over each of two spaced-apart surface regions and cured as in Example 1; each drop contained 46% by volume of aluminum after curing. A tinned No. 30 (American Wire Gage) copper wire was placed in contact with the exposed surface of each cured coating and the conductive silver paint of Example 1 was applied over each wire and to two opposing surface areas on the uncoated bottom side of the silicon chip. An activating potential of 100 volts in series with a 1.0 megohm current-limiting resistor was applied momentarily between the copper wire and the opposing paint electrode on the bottom of the chip. The resultant resistance in the forward direction of the formed diode structure (positive ohmmeter lead touched to the copper wire) was 5,000 ohms. In the reverse direction of the formed diode (positive ohmmeter lead touched to the painted chip) the resistance was 50,000 ohms (10:1 rectification ratio). Similar activation of the second diode-forming structure resulted in a ratio of 7,000/70,000 ohms (10:1 rectification ratio). Each diode was turned OFF by application of a rapidly decaying current pulse supplied from a 10 volt source, the first diode by a 200 milliampere pulse, the second diode by a 50 milliampere pulse. Forward and reverse resistances of both diodes in the OFF state were too high to be measured with the ohmmeter. Suitability of the diode for use in an AROM was demonstrated by momentary application of a 20-volt pulse to the second deactivated structure; this resulted in a 12,000/500,000 ohm forward/reverse ratio (40:1 rectification ratio). Upon repeating the turn OFF and turn ON once more, substantially the same forward/reverse resistance ratio was observed.

Example 5

A silicon wafer was doped with P, N and $N^+$ regions, 31, 32 and 30, respectively, as shown in FIG. 7, and then covered with an insulating layer 36 of $SiO_2$ about 0.5 micron thick and having apertures which were filled as follows. A metal particle-polymer coating composition was prepared by mixing 8 grams of oxide-encapsulated aluminum powder (0.03–0.07 micron particles), 20 ml. of N-methylpyrrolidone and 8 grams of polyamic acid solution (of the type used in Example 1). This composition was spread upon the exposed surface of the wafer by spinning and then the surface was very slightly washed with N-methylpyrrolidone. The wafer was baked for ½ hour at 135° C. to form coating 33. Aluminum was then evaporated onto the entire surface and etched thereon to provide aluminum metallized electrode 35. Any metal particle-polymer coating not covered by aluminum was then dissolved away with aqueous $\beta$-phenylethylamine. The wafer was then heated to 300 ° C. for one hour and additional aluminum was evaporated to form metallized electrode 34. Activation was accomplished by applying a D.C. potential of 30 volts through a 100 ohm resistor (electrode 34 was positive). The following voltages and amperages were measured (electrode 34 was positive):

0.6 volt—10 microamperes
0.9 volt—50 microamperes
1.05 volts —100 microamperes
25 volts —25 milliamperes.

Polarity was reversed and the following voltages and amperages were measured:

20 volts —10 microamperes
40 volts —100 microamperes.

These results show that a diode and associated conductive path were formed.

I claim as my invention:

1. Layered structure comprising
   a. a semiconductor body having a surface region of a given conductivity type,
   b. an electrically switchable coating on the surface region, said coating, upon being switched ON, providing an electrically conductive path through the coating to the surface region, and
   c. a diode in the zone of contact between the coating and the surface region, said coating before activation being a dispersed metal particle-polymer coating in contact with said surface region, the metal of said metal particles being capable of inducing a different type of conductivity in said surface region, said metal particles before activation being insulatively encapsulated and being present in the coating in an amount sufficient to provide electrical conductivity through the coating to said surface region and to form a diode in the zone of contact between said coating and said semiconductor body surface region upon application of an activating voltage to the layered structure, said diode being formed between said surface region of a given conductivity type and a portion of said surface region doped with said metal of said metal particles to be of different conductivity type to said conductivity type.

2. The structure of claim 1 wherein the semiconductor surface region in N-type, the metal is capable of inducing P-type conductivity in said semiconductor and the average particle size of the metal particles is 0.01–50 microns.

3. The structure of claim 2 wherein said polymer has a glass transition temperature of at least 40° C., the metal particles are oxide encapsulated aluminum particles, the coating contains 10–90% by volume of such particles, the semiconductor is silicon and the surface region of the semiconductor is N-type of substantially intrinsic.

4. The structure of claim 3 in a read-only memory comprising a plurality of such structures in a two-dimensional array having one semiconductor body in common.

5. The structure of claim 3 wherein said polymer has a glass transition temperature of at least 100° C.

6. The structure of claim 5 in a read-only memory comprising a plurality of such structures in a two-dimensional array having one semiconductor body in common.

7. The structure of claim 6 wherein the polymer is a polyimide.

8. The structure of claim 1 wherein the semiconductor surface region is P-type, the metal is capable of inducing N-type conductivity in said semiconductor and the average particle size of the metal particles is 0.01–50 microns.

9. The structure of claim 1 wherein said polymer has a glass transition temperature of at least 40 ° C., the metal particles are oxide encapsulated antimony particles, the coating contains 10–90% by volume of such particles, the semiconductor is silicon and the surface region of the semiconductor is P-type or substantially intrinsic.

10. The structure of claim 9 in a read-only memory comprising a plurality of such structures in a two-dimensional array having one semiconductor body in common.

11. The structure of claim 9 wherein said polymer has a glass transition temperature of at least 100° C.

12. The structure of claim 11 in a read-only memory comprising a plurality of such structures in a two-dimensional array having one semiconductor body in common.

13. The structure of claim 12 wherein the polymer is a polyimide.

14. The structure of claim 1 wherein ferromagnetic metal particles are present along with the insulatively encapsulated metal particles and the polymer is an elastic binder.

15. The structure of claim 14 wherein the metal particles are oxide encapsulated aluminum particles, the semiconductor is silicon and the surface region of the semiconductor in N-type or substantially intrinsic.

16. The structure of claim 15 wherein the ratio of ferromagnetic particles to aluminum particles is in the range 0.17:1 to 2:1.

17. The structure of claim 16 wherein the ferromagnetic particles are iron, cobalt or nickel particles or a mixture of any thereof.

18. The structure of claim 15 wherein the ferromagnetic particles are encapsulated with an insulative material having a volume resistivity of at least $10^{11}$ ohm-cm. at 50% relative humidity and 23° C. and the amount of the insulative material encapsulating the particles is 0.5–6% by weight of the combined weights of particles and insulative material.

19. The structure of claim 18 wherein the weight ratio of ferromagnetic particles to aluminum particles is in the range 0.17:1 to 3.5:1, wherein the dispersed metal particle-polymer coating contains 25–85% by weight of ferromagnetic particles and aluminum particles, such coating containing at least 10% by volume of aluminum particles, and wherein the amount of insulating material encapsulating the ferromagnetic particles is 1–3% by weight of the combined weights of ferromagnetic particles and the insulating material.

20. The structure of claim 17 wherein said coating contains 60–70% by weight of ferromagnetic particles and aluminum particles and the weight ratio of ferromagnetic particles to aluminum particles is about 1.5:1.

21. The structure of claim 18 wherein the insulative material encapsulating the ferromagnetic particles is an elastic binder capable of being elongated at least 100% and then retracting to less than 1.5 times its original length.

22. The structure of claim 4 wherein the encapsulating material is a polyolefin of ethylene, propylene and 1,4-hexadiene and wherein the polymeric binder in which the metal particles are dispersed in a polyurethane rubber.

23. The structure of claim 16 wherein the coating contains 40–80% by weight of ferromagnetic particles and aluminum particles and at least 10% by volume of aluminum particles.

24. The structure of claim 23 wherein the coating contains 60–70% by weight of ferromagnetic particles and aluminum particles and the weight ratio of ferromagnetic particles to aluminum particles is about 1.5:1.

25. The structure of claim 22 wherein the ratio of ferromagnetic to aluminum particles, by weight, is 1.5:1 to 2.5:1.

26. The structure of claim 22 wherein the combined weights of the aluminum particles and the ferromagnetic particles are 60–70% of the total weight of said particles and the elastic binder.

27. An array comprising a plurality of layered diode-forming structures, each layered structure comprising a semiconductor body having a coating thereon, said coating being connected to an electrode means, said semiconductor body having a surface region of a given conductivity type, said coating being a dispersed metal particle-polymer coating in contact with said surface region, the metal of said metal particles being capable of inducing a different type of conductivity in said surface region, said metal particles being insulatively encapsulated and being present in the coating in an amount sufficient to provide electrical conductivity through the coating and to form a diode in the zone of contact between said coating and said semiconductor body upon application of an activating voltage to the layered structure, said semiconductor surface regions of said plurality of structures being of the same conductivity type and being electrically connected in common.

28. Array of claim 27 wherein said semiconductor surface regions of said plurality of structures constitute a common region.

29. Array of claim 27 comprising at least one layered structure comprising
 a. a semiconductor body having a surface region of a given conductivity type,
 b. an electrically switchable coating on the surface region, said coating, upon being switched ON, providing an electrically conductive path through the coating to the surface region, and
 c. a diode in the zone of contact between the coating and the surface region,
said coating before activation being a dispersed metal particle-polymer coating in contact with said surface region, the metal of said metal particles being capable of inducing a different type of conductivity in said surface region, said metal particles before activation being insulatively encapsulated and being present in the coating in an amount sufficient to provide electrical conductivity through the coating to said surface region and to form a diode in the zone of contact between said coating and said semiconductor body surface region upon application of an activating voltage to the layered structure, said diode being formed between said surface region of a given conductivity type and a portion of said surface region doped with said metal of said metal particles to be of different conductivity type to said conductivity type.

* * * * *

UNITED STATES PATENT OFFICE
CERTIFICATE OF CORRECTION

PATENT NO. : 3,990,098
DATED : November 2, 1976
INVENTOR(S) : Sebastian Vito Rocco Mastrangelo It is certified that error appears in the above-identified patent and that said Letters Patent are hereby corrected as shown below:

Column 14, line 60, Claim 2, of the patent reads "region in N-type" and should read --region is N-type--.

Column 15, line 1, Claim 3, of the patent reads "N-type of" and should read --N-type or--.

Signed and Sealed this

Tenth Day of May 1977

[SEAL]

Attest:

RUTH C. MASON
Attesting Officer

C. MARSHALL DANN
Commissioner of Patents and Trademarks